(12) United States Patent
Xu et al.

(10) Patent No.: US 10,205,453 B2
(45) Date of Patent: Feb. 12, 2019

(54) SELF-TIMED PROCESSORS IMPLEMENTED WITH MULTI-RAIL NULL CONVENTION LOGIC AND UNATE GATES

(71) Applicant: Eta Compute, Inc., Westlake Village, CA (US)

(72) Inventors: Chao Xu, Thousand Oaks, CA (US); Gopal Raghavan, Thousand Oaks, CA (US); Ben Wiley Melton, Thousand Oaks, CA (US); Vidura Manu Wijayasekara, Thousand Oaks, CA (US); Bryan Garnett Cope, Austin, TX (US); David Cureton Baker, Austin, TX (US); John Whitaker Havlicek, Thousand Oaks, CA (US)

(73) Assignee: Eta Compute, Inc., Westlake Village, CA (US)

( * ) Notice: Subject to any disclaimer, the term of this patent is extended or adjusted under 35 U.S.C. 154(b) by 0 days.

(21) Appl. No.: 15/948,733

(22) Filed: Apr. 9, 2018

(65) Prior Publication Data

US 2018/0294810 A1 Oct. 11, 2018

Related U.S. Application Data

(60) Provisional application No. 62/483,657, filed on Apr. 10, 2017.

(51) Int. Cl.
*H03K 19/003* (2006.01)
*H03K 19/177* (2006.01)

(52) U.S. Cl.
CPC ......... *H03K 19/003* (2013.01); *H03K 19/177* (2013.01)

(58) Field of Classification Search
CPC ........................... H03K 19/103; H03K 19/177
USPC .......................................................... 326/56
See application file for complete search history.

(56) References Cited

U.S. PATENT DOCUMENTS

| 6,513,108 | B1 * | 1/2003 | Kerr | G06F 15/17337 712/19 |
| 6,681,341 | B1 * | 1/2004 | Fredenburg | G06F 11/2242 712/10 |
| 8,990,466 | B2 * | 3/2015 | Bacigalupo | G06F 13/366 710/240 |
| 2002/0188912 | A1 * | 12/2002 | Kondratyev | G06F 7/00 716/103 |

(Continued)

FOREIGN PATENT DOCUMENTS

CA 2341981 A1 * 3/2000 ............... G06F 5/08

*Primary Examiner* — Dylan C White
(74) *Attorney, Agent, or Firm* — SoCal IP Law Group LLP; Steven C. Sereboff; Angelo Gaz

(57) ABSTRACT

There is disclosed a self-timed processor. The self-timed processor includes a plurality of functional blocks comprising null convention logic. Each of the functional blocks outputs one or more multi-rail data values. A global acknowledge tree generates a global acknowledge signal provided to all of the plurality of functional blocks. The global acknowledge signal switches to a first state when all of the multi-rail data values output from the plurality of functional blocks are in respective valid states, and the global acknowledge signal switches to a second state when all of the multi-rail data values output from the plurality of functional blocks are in a null state.

20 Claims, 6 Drawing Sheets

| | | | | Th Gates (FIG. 2A) | | Unate Gates (FIG. 2B) | |
|---|---|---|---|---|---|---|---|
| AT | AF | BT | BF | (A+B)T | (A+B)F | (A+B)T | (A+B)F |
| 0 | 0 | 0 | 0 | 0 | 0 | 0 | 0 |
| 0 | 0 | 0 | 1 | H | H | 0 | 0 |
| 0 | 0 | 1 | 0 | H | H | 1 | 0 |
| 0 | 1 | 0 | 0 | H | H | 0 | 0 |
| 1 | 0 | 0 | 0 | H | H | 1 | 0 |
| 0 | 1 | 0 | 1 | 0 | 1 | 0 | 1 |
| 0 | 1 | 1 | 0 | 1 | 0 | 1 | 0 |
| 1 | 0 | 0 | 1 | 1 | 0 | 1 | 0 |
| 1 | 0 | 1 | 0 | 1 | 0 | 1 | 0 |

"H" = hold previous state

(56) References Cited

U.S. PATENT DOCUMENTS

| | | | | |
|---|---|---|---|---|
| 2008/0012612 A1* | 1/2008 | Lepek | ............... | G06F 1/08 |
| | | | | 327/142 |
| 2014/0247088 A1* | 9/2014 | Prager | ............... | H03K 19/0008 |
| | | | | 327/544 |
| 2014/0292371 A1* | 10/2014 | Di | ............... | G09C 1/00 |
| | | | | 326/95 |
| 2016/0142057 A1* | 5/2016 | Melton | ............... | H03K 19/09429 |
| | | | | 326/56 |

\* cited by examiner

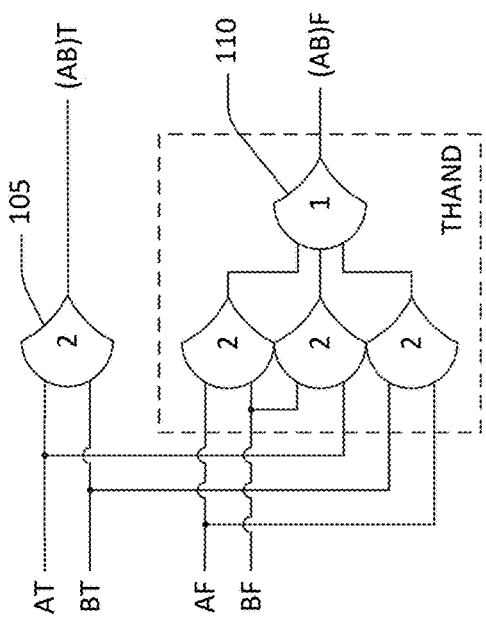
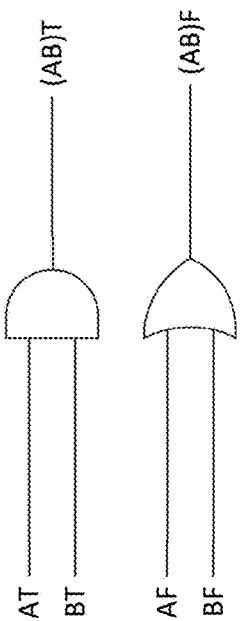
| AT | AF | BT | BF | Th Gates (FIG. 1A) | | Unate Gates (FIG. 1B) | |
|---|---|---|---|---|---|---|---|
| | | | | (AB)T | (AB)F | (AB)T | (AB)F |
| 0 | 0 | 0 | 0 | 0 | 0 | 0 | 0 |
| 0 | 0 | 0 | 1 | H | H | 0 | 1 |
| 0 | 0 | 1 | 0 | H | H | 0 | 0 |
| 0 | 1 | 0 | 0 | H | H | 0 | 1 |
| 1 | 0 | 0 | 0 | H | H | 0 | 0 |
| 0 | 1 | 0 | 1 | 1 | 1 | 1 | 1 |
| 0 | 1 | 1 | 0 | 1 | 1 | 1 | 1 |
| 1 | 0 | 0 | 1 | 0 | 1 | 0 | 1 |
| 1 | 0 | 1 | 0 | 1 | 0 | 1 | 0 |
"H" = hold previous state
FIG. 1A
FIG. 1B
FIG. 1C

| AT | AF | BT | BF | Th Gates (FIG. 2A) | | Unate Gates (FIG. 2B) | |
|---|---|---|---|---|---|---|---|
| | | | | (A+B)T | (A+B)F | (A+B)T | (A+B)F |
| 0 | 0 | 0 | 0 | 0 | 0 | 0 | 0 |
| 0 | 0 | 0 | 1 | H | H | 0 | 0 |
| 0 | 0 | 1 | 0 | H | H | 1 | 0 |
| 0 | 1 | 0 | 0 | H | H | 0 | 0 |
| 1 | 0 | 0 | 0 | H | H | 1 | 0 |
| 0 | 1 | 0 | 1 | 0 | 1 | 0 | 1 |
| 1 | 0 | 1 | 0 | 1 | 0 | 1 | 0 |
| 0 | 1 | 1 | 0 | 1 | 0 | 1 | 0 |
| 1 | 0 | 0 | 1 | 1 | 0 | 1 | 0 |
"H" = hold previous state
FIG. 2C
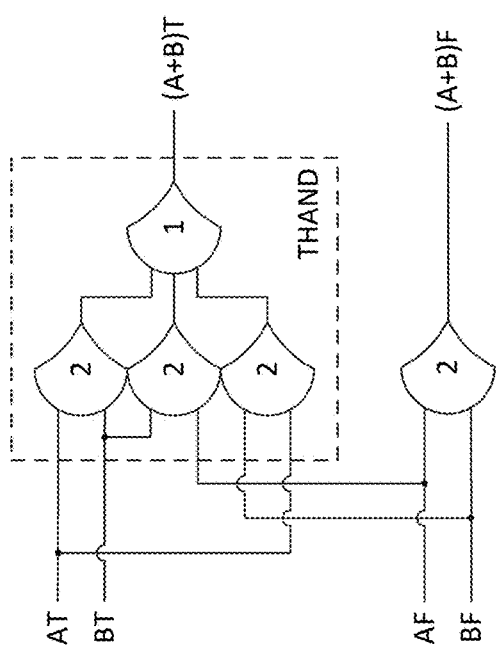
FIG. 2A
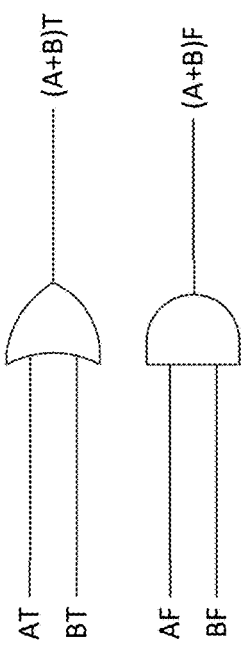
FIG. 2B

SELF-TIMED PROCESSORS IMPLEMENTED WITH MULTI-RAIL NULL CONVENTION LOGIC AND UNATE GATES

RELATED APPLICATION INFORMATION

This patent claims priority from provisional patent application 62/483,657, filed Apr. 10, 2017, titled ASYNCHRONOUS PROCESSORS IMPLEMENTED WITH DUAL-RAIL LOGIC AND UNATE GATES.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to asynchronous digital logic circuits.

Description of the Related Art

In this patent, the term "processor" means a digital circuit that performs some sequence of operations. A processor may typically, but not necessarily, execute stored instructions to accomplish its assigned function. Processors that typically execute stored instructions include microprocessors, microcontrollers, digital signal processors, and coprocessors. Processors that do not execute stored instructions include single-purpose processors such as encryption engines and fast Fourier transform engines. The sequence of operations performed by such engines may be controlled, for example, by a hardware state machine rather than stored instructions.

Most digital processors in use today are synchronous, which is to say various elements within the digital processor operate synchronously in response to a common clock signal. The power consumption of a synchronous processor depends on the complexity of the processor (i.e. the number of gates and other functional elements), the clock rate, and the operating voltage. In general, higher operating speed requires higher operating voltage.

Asynchronous, or self-timed, processor circuits do not operate from a common clock signal, such that the delay of a self-timed processor is determined solely by the cumulative delay of the gates and other logic elements within the self-timed processor. Self-timed processors are typically operated in a cyclic manner. A cycle is initiated when input data is provided to the processor. The processor then performs some operation upon the input data, with the time required to perform the operation determined by the accumulated delays of the logic circuits within the processor. When the operation is complete and all of the outputs of the processor have assumed their final values, a feedback or acknowledge signal may be generated to indicate completion of the current cycle and readiness to begin the next cycle.

Null convention logic (NCL) is a delay-insensitive logic paradigm in which each Boolean variable has three defined states: "True", "False", and "null", where the null state indicates that a valid value is not yet available. In this patent, the term "valid" means a Boolean variable is in either the True or False states. NCL processors typically employ a combination of dual-rail logic and threshold gates.

Dual-rail logic is a form of NCL that uses two signals or rails, each of which has two possible values (1 or 0), to represent each Boolean variable. In this patent, the two signals will be referred to as the "true" and "false" rail. For a Boolean variable "A", the two rails will be designated as AT, and AF. A Boolean "1" or "true" state is represented by AT=1, AF=0, and a Boolean "0" or "false" state is represented by AT=0, AF=1. Either of these are "valid" or "valid states". The null state is represented by AT=AF=0. The state AT=AF=1 is forbidden. Another form of NCL uses four rails or signals to collectively represent two Boolean variables. In this patent, the term "multi-rail" encompasses both dual-rail and four-rail implementations of NCL. The term "single-rail" means a conventional binary value.

An NCL processor is typically operated in a cyclical manner. All of the inputs to an NCL processor are initially set to the null state, which then propagates through the processor until all of the outputs of the processor assume the null state. This is considered the "null phase" of the processing cycle. When all of the outputs of the processor are in the null state, the processor sets an acknowledge signal output to a first state (commonly called "request for data") indicating the processor is ready for new data. The inputs to the processor are then set to valid states, which then propagate through the processor until all of the outputs also assume valid states. This is considered the "data phase" of the processing cycle. When all of the outputs have assumed valid states, the cycle is complete and the acknowledge signal is set to a second state (commonly called "request for hull") to initiate the next cycle. An NCL processor may be divided into multiple functional blocks typically arranged as a pipeline. In this case, each functional block may generate a respective acknowledge signal that is provided to the predecessor functional block in the pipeline.

Threshold gates are a type of logic gate, where "gate" is defined as a logic circuit having two or more inputs combined into a single output. The output of a threshold gate is set to 0 only when all of its inputs are 0. The output of a threshold gate is set to 1 when a predetermined combination of inputs are all 1. With other combinations of inputs, the output of the threshold gate retains its previous value. A nomenclature commonly used to describe some types of threshold gates is "THmn", where n and m are integers between one and four. "n" is the number of inputs to the gate, and "m" is the number of inputs that must be 1 for the output of the gate to switch to 1.

The use of only threshold gates for combinatorial logic provides both "input completeness" and "null completeness." Input completeness means all of the outputs of a block of combinatorial logic can be in valid states only if all of the inputs and all of the interval Boolean values within the block are also in valid states. Null completeness means all of the outputs can be in the null state only if all inputs and all of the interval Boolean values within the block are in the "null" state. The completion of the data phase and the null phase of NCL processor implemented with multi-rail logic and only threshold gates can be unambiguously detected. Thus the results provided by an NCL processor implemented with multi-rail logic and only threshold gates are insensitive to the propagation delays of the individual gates within the processor.

DESCRIPTION OF THE DRAWINGS

FIG. 1A is a circuit diagram of a circuit that performs a logical AND operation on two dual-rail Boolean variables using threshold gates.

FIG. 1B is a circuit diagram of a circuit that performs a logical AND operation on two dual-rail Boolean variables using unate gates.

FIG. 1C is a Truth Table summarizing the operation of the circuits of FIG. 1A and FIG. 1B.

FIG. 2A is a circuit diagram of a circuit that performs a logical OR operation on two dual-rail Boolean variables using threshold gates.

FIG. 2B is a circuit diagram of a circuit that performs a logical OR operation on two dual-rail Boolean variables using unate gates.

FIG. 2C is a Truth Table summarizing the operation of the circuits of FIG. 2A and FIG. 2B.

Figure 3:
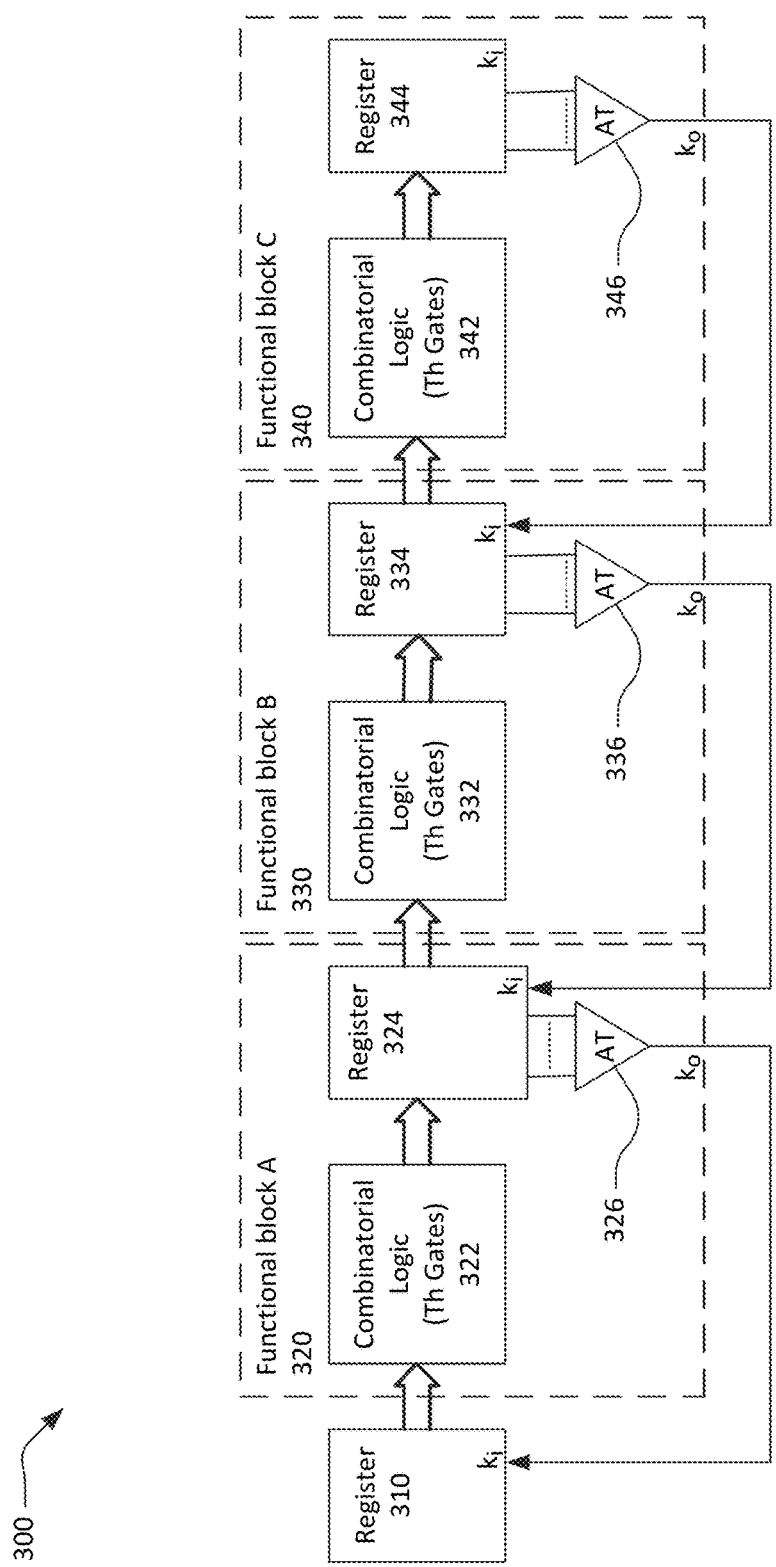
FIG. 3 is a block diagram of a conventional self-timed processor using null convention logic and threshold gates.

Throughout this description, elements appearing in figures are assigned three-digit reference designators, where the most significant digit is the figure number where the element is introduced and the two least significant digits are specific to the element. An element that is not described in conjunction with a figure may be presumed to have the same characteristics and function as a previously-described element having the same reference designator.

DETAILED DESCRIPTION

Description of Apparatus

FIG. 1A is a schematic diagram of a circuit to perform a logical AND of two dual rail Boolean variables A and B using threshold gates. AT and AF are a dual-rail representation of variable A, BT, and BF are a dual-rail representation of variable B, and (AB)T and (AB)F are a dual-rail representation of the logical AND of variables A and B. As shown, the logical AND of two dual-rail variables using threshold gates requires five gates and incurs a delay of two gates in series. In FIG. 1 and subsequent figures, the integer number within a gate symbol indicates the number of inputs that must be logical one to switch the output of the gate to logical one. The gate 105 is a TH22 gate and the gate 110 is a TH13 gate. The circuit of FIG. 1A provides input completeness, which is to say the (AB)T and (AB)F outputs will not be asserted until both variables A and B are valid (i.e. either True or False rather than Null). Similarly, the circuit of FIG. 1A provides "NULL" completeness which is to say the (AB)T and (AB)F outputs will not transit to NULL states until both variables A and B are in NULL states.

A unate function is a Boolean logical function that is monotonic for each variable. A unate gate is a logical circuit that implements a unate function. In simpler terms, a unate function is a function where a change in an input in a particular direction (i.e. either from 0 to 1, or from 1 to 0) can cause the output to change in only one direction. For example, changing one input to an AND gate from 0 to 1 may cause the output to change from 0 to 1 (if all of the other inputs were already 1), but can never cause the output to change from 1 to 0. In contrast, changing an input to an exclusive OR gate may cause the output to change from 1 to 0 or from 0 to 1 depending on the values of the other inputs to the exclusive OR gate. AND gates and OR gates are unate gates. Exclusive OR gates and multiplexers are examples of non-unate gates. Although inversion is a unate function, an inverter is not considered a unate gate as "gate" is defined in this patent.

FIG. 1B is a schematic diagram of a circuit to perform a logical AND of two dual-rail Boolean variables A and B using unate gates. As shown the logical AND of two dual-rail variables using unate gates requires two gates and incurs only a single gate delay.

FIG. 1C is a truth table describing the operation of the circuits of FIG. 1A and FIG. 1B. The circuit of FIG. 1A provides input completeness in that the (AB)T and (AB)F outputs remain in the null state, with (AB)T=(AB)F=0, until both variables A and B are valid (i.e. either True or False rather than Null). However, the circuit of FIG. 1B does not provide input completeness since the circuit does not hold a previous output value when only one of the input vales is valid (see the shaded elements in the table). In particular, output (AB)F will be asserted when either A or B has a false value, whether or not the other variable is valid. Note that the circuit of FIG. 1B never provides an incorrect output but may provide a correct valid output before all of the gate's inputs are valid.

FIG. 2A, FIG. 2B, and FIG. 2C provide a similar comparison of the logical OR function of two dual-rail Boolean variables using threshold gates (FIG. 2A) or unate gates (FIG. 2B). As was the case with the logical AND function, the implementation using threshold gates requires more gates and longer delay that the implementation with unate gates. The circuit of FIG. 2A provides input completeness in that the (A+B)T and (A+B)F outputs remain in the null state, with (A+B)T=(A+B)F=0, until both variables A and B are valid (i.e. either True or False rather than Null). However, the circuit of FIG. 2B does not provide input completeness since the circuit does not hold a previous output value when only one of the input vales is valid (see the shaded elements in the table). In particular, the output (A+B)T will be asserted. when either A or B has a true value, whether or not the other variable is valid. Note that the circuit of FIG. 1B never provides an incorrect output.

FIG. 3 is a block diagram of a conventional asynchronous or self-timed processor 300 implemented with multi-rail null convention logic and threshold gates. The asynchronous processor 300 includes an input register 310 and three functional blocks 320, 330 340 in a pipelined configuration. In the asynchronous processor 300, each of the register 310 and the functional blocks 320 and 330 provide multi-rail data to the subsequent functional block in the pipeline. Each of the functional blocks 320, 330, and 340 receives multi-rail data from the previous element in the pipeline. In FIG. 3 and subsequent figures bold open arrows indicate multi-rail data paths. Non-bold arrows indicate single-rail data paths.

Functional blocks within an asynchronous processor are typically operated in a cyclical manner. For example, in processors using null convention logic, all of the inputs to a functional block are initially set to the null state. The null state propagates through the functional block until all of the outputs of the functional block assume the null state. This may be termed the "null phase" of the processing cycle. The inputs are then set to valid states. The valid inputs propagate through the functional block until all of the outputs of the functional block also assume valid states. This may be termed the "data phase" of the processing cycle. An acknowledge signal is provided from the output side of the processor to the input side to manage the initiation of the null and data phases of successive processing cycles.

The acknowledge signal is a binary signal having two states. An acknowledge signal transitions into its first state to indicate that all of the outputs of the corresponding functional block have valid true or false states. The first state of the acknowledge signal is commonly called "request for null" since it indicates the associated functional block has finished processing data and is ready for its inputs to be set to the null state to commence the next processing cycle. The acknowledge signal transitions from the first state to the second state to indicate that all of the output of the corresponding functional block are in the null state. The second state of the acknowledge signal is commonly called "request for data" since it indicates the null state has propagated through the associated functional block and the block is ready to receive data to continue the processing cycle.

In the conventional asynchronous processor 300, each of the functional blocks 320, 330, 340 includes combinatorial logic 322, 332, 342, a register 324, 334, 344, and an acknowledge tree (AT) 326, 336, 346. The combinatorial logic blocks 322, 332, 342 are implemented using threshold (Th) gates. Each acknowledge tree 326, 336, 346 provides a respective acknowledge output $k_o$ indicating the state of the corresponding functional block. Specifically, each acknowledge output switches to "request for data" when all of the outputs of the corresponding register are in the null state. Each acknowledge output switches to "request for null" when all of the outputs of the corresponding register are in valid true or false states. An acknowledge tree may also be termed a "completion tree" or "completion logic".

The acknowledge output $k_o$ from the acknowledge tree within each block 320, 330, 340 provides an acknowledge signal to a respective acknowledge input $k_i$ of the predecessor functional block 310, 320, 330 respectively, in the pipeline. Since each functional block 310, 320, 330, 340 is implemented using threshold gates, each functional block has input completeness. One consequence of input completeness is that all of the outputs from each functional block cannot have valid states unless all of the inputs to the block also have valid states. Similarly, all of the outputs from the block cannot be in the null state unless all of the inputs to the block are in the null state. Specifically, an acknowledge signal will not transition from "request for null" to "request for data" until all of the inputs to the corresponding functional block are in the null state. Similarly, an acknowledge signal will not transition from "request for data" to "request for null" until all of the inputs to the corresponding functional block are in valid true or false states.

Although not shown in FIG. 3, some or all of the registers 310 and the functional blocks 320, 330, 340 may receive data from sources external to the processor 300 or provide data to destinations external to the processor 300. For example, the register 310 may receive data from sources external to the processor 300, in which case register 310 may provide an acknowledge signal (not shown) to the external sources. The register 344 may provide data to destinations external to the processor 300, in which case register 344 may receive an acknowledge signal (not shown) from the external destinations.

Figure 4:
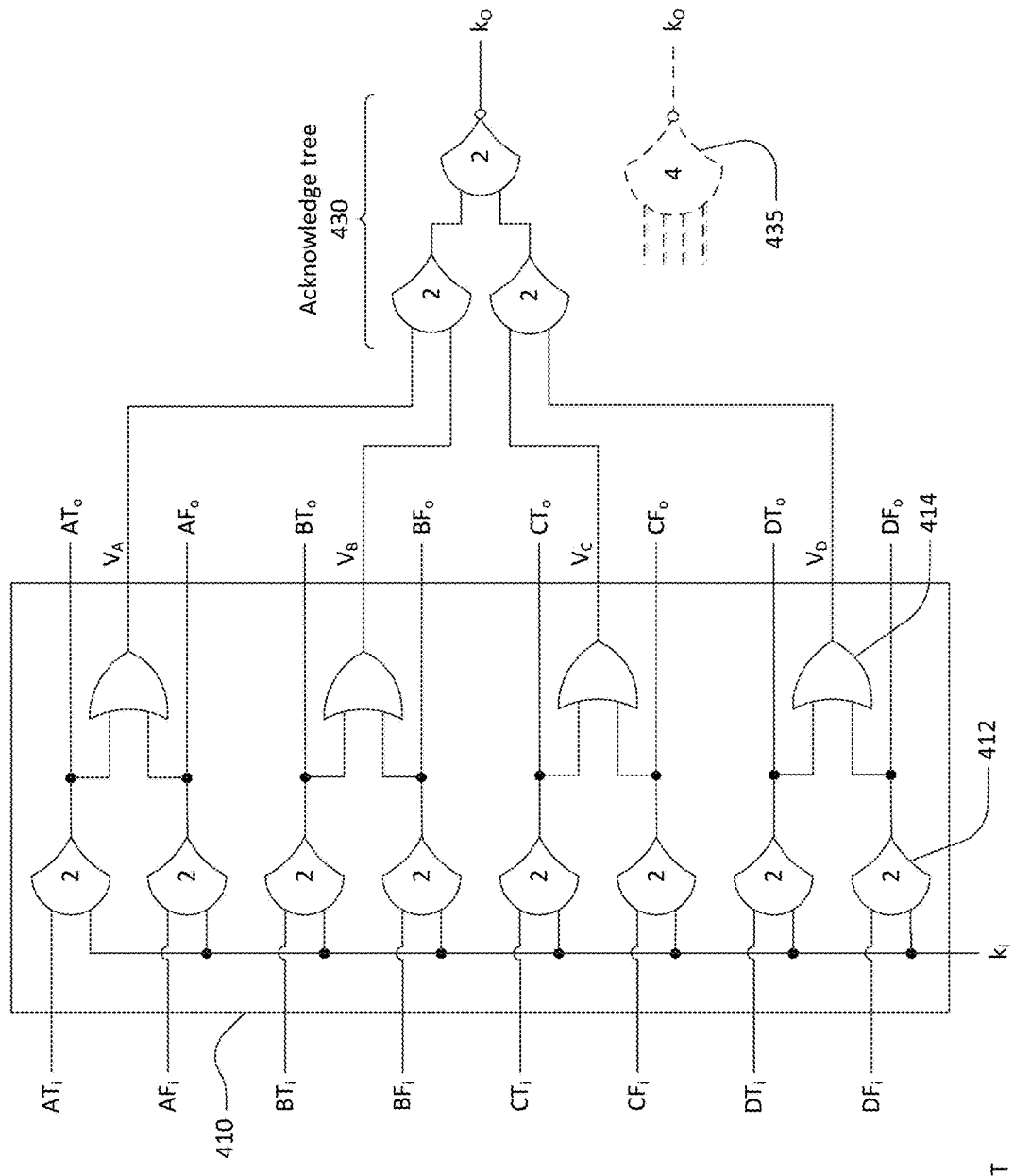
FIG. 4 is an example of an acknowledge tree.

The structure of the asynchronous processor 300 is exemplary and an asynchronous processor may contain fewer than, or more than, three functional blocks, which may be interconnected in a variety of ways other than a simple pipeline. In general, each functional block in an asynchronous processor provides data to and/or receives data from at least one other functional block. Further, each functional block provides an acknowledge signal to and/or receives an acknowledge signal from at least one other functional block. Typically, each function block provides its acknowledge signal to other function blocks from which it receives data, and each function block receives an acknowledge signal from other function blocks to which it provides data FIG. 4 is a logic diagram of a conventional register 410 and acknowledge tree 430. The register 410 may be, for example, all or a portion of one of the registers 310, 324, 334, 344 shown in FIG. 3. The acknowledge tree 430 may be, for example, all or a portion of one of the acknowledge trees 326, 336, 346. In this example, the register 410 receives input data signals $AT_i$ through $DF_i$ representing four dual-rail Boolean variables A, B, C, D. The register outputs the four dual-rail Boolean variables as output data signals $AT_o$ through $DF_o$. Each input data signal is applied to one input of a respective TH22 gate, such as gate 412. An acknowledge input $k_i$ is applied to the second input of each TH22 gate. The output of each TH22 gates switches to 0 when the respective input data signal is 0 and the acknowledge input is 0 (request for null in this example). The output of each TH22 gates switches to 1 when the respective input data signal is 1 and the acknowledge input is 1 (request for data in this example). For other combinations of inputs each TH22 gate holds its previous state. The use of TH22 gates in registers is exemplary and other forms of registers may be used.

The register 410 also outputs four valid signals $V_A$, $V_B$, $V_C$, $V_D$. Each valid signal indicates whether or not the respective Boolean output is in a valid state. The valid signals may be generated by respective unate OR gates, such as gate 414, or by TH12 gates (which have the same function as a unate OR gate, or in some other manner. In this example, a valid signal equal to 1 indicates the respective Boolean output is in a valid state and a valid signal equal to 0 indicates the respective Boolean output is in the null state.

The acknowledge tree 430 combines the four valid signals $V_A$, $V_B$, $V_C$, $V_D$ using a tree of three TH22 gates to generate an acknowledge output $k_o$. The output of the last TH22 gate is inverted. In this example, the acknowledge output $k_o$ switches to 0 (request for null) when all four valid signals $V_A$, $V_B$, $V_C$, $V_D$ are 1, which is to say when all outputs of the register 410 are valid. The acknowledge output $k_o$ switches to 1 (request for data) when all four valid signals $V_A$, $V_B$, $V_C$, $V_D$ are 0, which is to say when all outputs of the register 410 are null. The acknowledge output $k_o$ could have been generated by a single TH44 gate 435 instead of the three TH22 gates.

A register in a self-timed NCL processor may output fewer than or more than four multi-rail Boolean variables. A respective valid signal may be associated with each Boolean variable. All of the valid signals may be combined by a tree consisting of TH22, TH33, and TH44 gates to provide an acknowledge output that switches to a first state when all outputs of the register 410 are null, and switches to a second state when all outputs of the register are valid.

Figure 5:
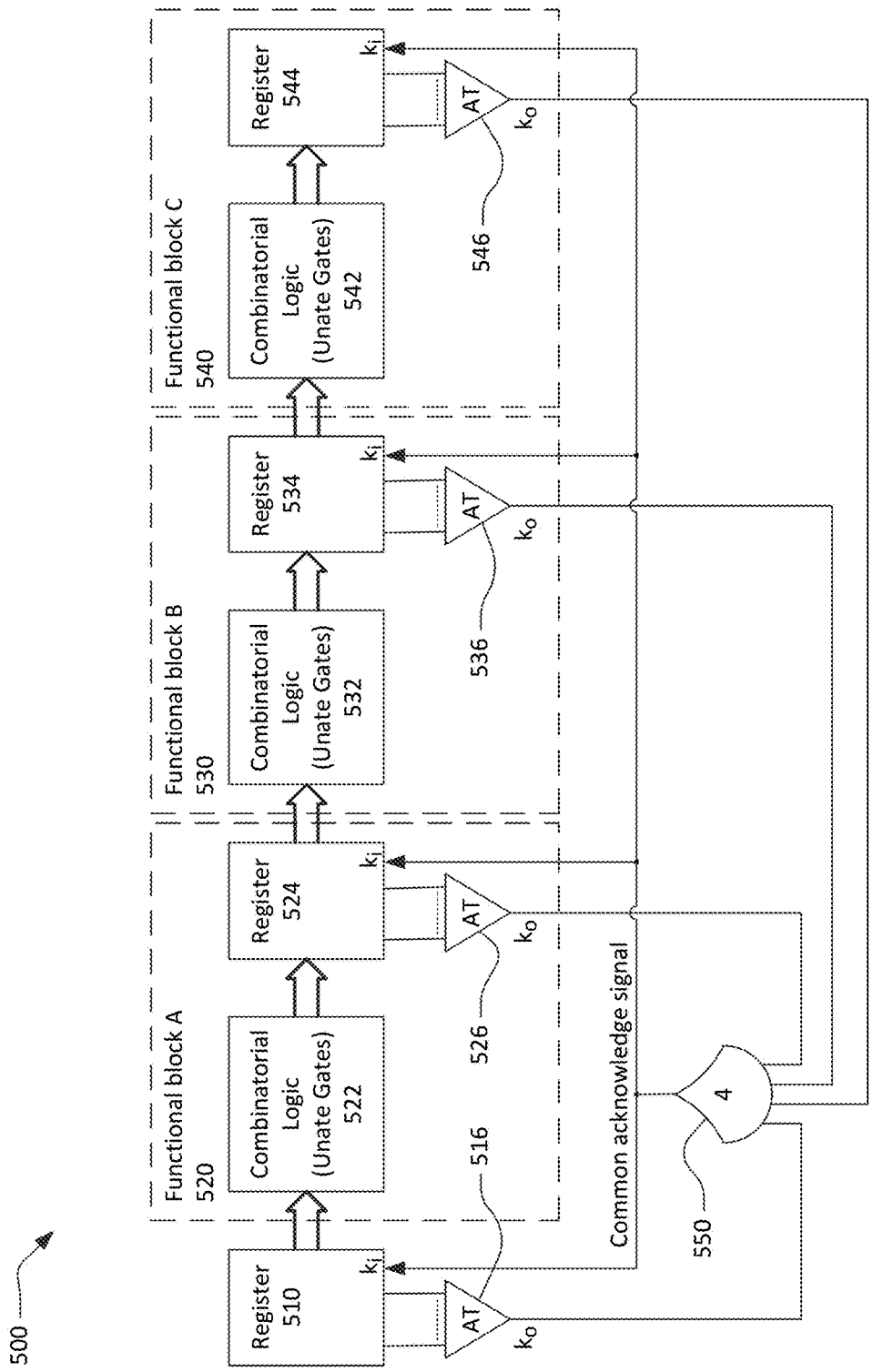
FIG. 5 is a block diagram of an exemplary self-timed processor using null convention logic, unate gates, and a global acknowledge tree.

FIG. 5 is a block diagram of a self-timed processor 500 implemented using multi-rail null convention logic and unate gates. The asynchronous processor 500 includes an input register 510 and three functional blocks 520, 530, 540 in a pipelined configuration. Each of the functional blocks 520, 530, 540 includes combinatorial logic 522, 532, 542, a register 524, 534, 544, and an acknowledge tree (AT) 526, 536, 546. At least one of the combinatorial logic blocks 522, 532, 542 is implemented using at least some unate gates. All of the combinatorial logic blocks 522, 532, 542 may include unate gates. Some or all of the combinatorial logic blocks 522, 532, 542 may include only unate gates. Each acknowledge tree 526, 536, 546 provides a respective acknowledge output $k_o$ indicating the state of the corresponding functional block as previously described. The register 510 also provides an acknowledge output $k_o$ from a respective acknowledge tree 516 indicating the state of the outputs from the register. Since the combinatorial logic blocks 522, 532, 542 include unate gates, rather than exclusively threshold gates, the self-timed processor 500 requires fewer gates (and corresponding less silicon area in an integrated circuit) than the processor 300 to perform the same functions with lower propagation delays and lower power consumption.

However, since the combinatorial logic blocks 522, 532, 542 contain unate gates, input completeness is not guaranteed. Thus, the processing performed by the self-timed processor 500 may be delay sensitive. For example, it may be possible for a functional block to complete its processing tasks and switch its acknowledge output before the predecessor functional block completes its respective tasks. This can lead to errors in the processes performed by the self-timed processor.

To avoid the possibility of delay sensitivity, the acknowledge outputs of the registers and functional blocks may be collected and combined to provide a common or global acknowledge input to all functional blocks. To ensure that the global acknowledge input is not inserted until all the acknowledge outputs from the register 510 and functional blocks 520, 530, 540 are valid, the acknowledge outputs $k_o$ from the register 510 and functional blocks 520, 530, 540 are combined using one or more threshold gates. As shown in FIG. 4, the acknowledge outputs may be combined using a TH44 gate 550, which is to say a threshold gate having four inputs. The output of a TH44 gate switches to "1" only when all four inputs are "1". The output of the TH44 gates switches to "0" only when all four inputs are "0". For other combinations of inputs, the output holds its previous state. The global acknowledge signal switches to the request for null state when all of the outputs from all registers and functional blocks are valid. The global acknowledge signal switches to the request for data state when all of the outputs from all registers and functional blocks are null.

Although not shown in FIG. 5, some or all of the registers 510 and the functional blocks 520, 530, 540 may receive data from sources external to the processor 500 or provide data to destinations external to the processor 500. For example, the register 510 may receive data from sources external to the processor 500 and/or the register 544 may provide data to destinations external to the processor 500. The common acknowledge signal may be provided to the external sources and/or destinations.

Figure 6:
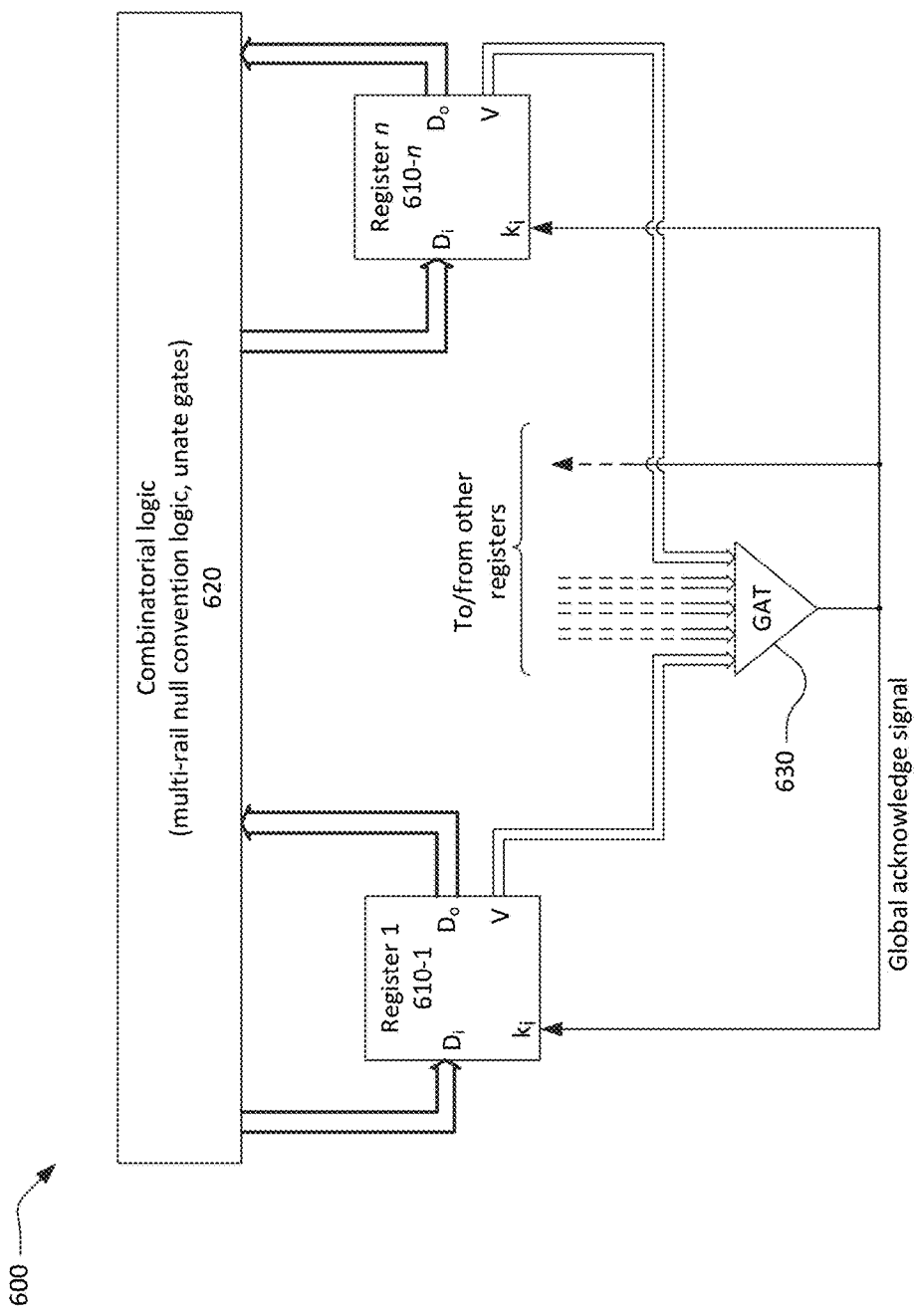
FIG. 6 is a block diagram of a generalized self-timed processor using null convention logic, unate gates, and a global acknowledge tree.

FIG. 6 is a block diagram of a generalized self-timed processor 600 using multi-rail null convention logic, unate gates, and a global acknowledge tree. The self-timed processor 600 includes n registers, where n is an integer greater than one. The n registers are identified in FIG. 6 as register 1 to register n, 610-1 to 610-n. The self-timed processor 600 also includes multi-rail null convention combinatorial logic 620 that receives multi-rail data values from the outputs of some or all of the registers 610-1 to 610-n and provides multi-rail data values to the inputs of some or all of the registers 610-1 to 610-n. Although not shown in FIG. 6, some or all of the registers 610-1 to 610-n and/or the combinatorial logic 620 may receive data from sources external to the processor 600 or provide data to destinations external to the processor 600.

The combinatorial logic 620 may be implemented in whole, or in part, using unate gates. At least two multi-rail NCL data values output from one or more of the registers 610-1 to 610-n may be combined using unate gates to provide at least one multi-rail NCL data value input to one of the registers. All, or nearly all, of the multi-rail NCL data values input to the registers 610-1 to 610-n from the combinatorial logic may be generated by combining multi-rail NCL data values using unate gates.

The processor 600 includes a global acknowledge tree (GAT) 630 to generate a global acknowledge signal provided to all of the registers 610-1 to 610-n. The global acknowledge signal may also be provided to destinations external to the processor 600. The global acknowledge tree 630 combines valid (V) signals received from the registers 610-1 to 610-n using exclusively threshold gates to generate the global acknowledge signal. The global acknowledge signal switches to a first state (i.e. request for null) when all of the multi-rail data values output from the registers 610-1 to 610-n are in respective valid states. The global acknowledge signal switches to a second state (i.e. request for data) when all of the multi-rail data values output from the registers 610-1 to 610-n are in the null state.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A self-timed processor comprising:
a plurality of functional blocks comprising multi-rail null convention logic, each of the functional blocks to output one or more multi-rail data values that each alternate between a valid state and a null state, and
a global acknowledge tree to generate a global acknowledge signal provided to all of the plurality of functional blocks, wherein
the global acknowledge signal switches to a first state when all of the one or more multi-rail data values output from all of the plurality of functional blocks are in respective valid states, and the global acknowledge signal switches to a second state when all of the one or more multi-rail data values output from all of the plurality of functional blocks are in the null state.

2. The self-timed processor of claim 1, wherein each of the plurality of functional blocks further comprises:
a register to output an acknowledge signal to the global acknowledge tree; and
combinatorial logic to output the one or more multi-rail data values to the register,
wherein the combinatorial logic of at least one of the plurality of functional blocks comprises one or more non-threshold, unate gates.

3. The self-timed processor of claim 2, wherein the combinatorial logic of all of the plurality of functional blocks comprises one or more unate gates, which do not provide input completeness.

4. The self-timed processor of claim 3, wherein the combinatorial logic of all of the plurality of functional blocks does not include threshold gates.

5. The self-timed processor of claim 4, wherein the registers included in the plurality of functional blocks comprise threshold gates.

6. The self-timed processor of claim 1, wherein the global acknowledge tree comprises gates that are only threshold gates, and which provide input completeness.

7. The self-timed processor of claim 1, wherein at least some of the plurality of functional blocks are arranged as a pipeline.

8. The self-timed processor of claim 1, wherein at least one of the plurality of functional blocks receives data from a source external to the self-timed processor, and
the global acknowledge signal is provided to the source.

9. The self-timed processor of claim 1, wherein at least one of the plurality of functional blocks sends data to a destination external to the self-timed processor, and
the global acknowledge signal is provided to the destination.

10. The self-timed processor of claim 1, wherein at least one of the plurality of registers sends data to a destination external to the self-timed processor, and
the global acknowledge signal is provided to the destination.

11. The self-timed processor of claim 1, wherein
the global acknowledge signal switches to a first state to signal the functional blocks to enter a null phase when all of the one or more multi-rail data values output from all of the plurality of functional blocks are in respective valid states, and
the global acknowledge signal switches to a second state to signal the functional blocks to enter a data phase when all of the one or more multi-rail data values output from all of the plurality of functional blocks are in a null state.

12. A self-timed processor comprising:
a plurality of registers; and
a global acknowledge tree to generate a global acknowledge signal provided to all of the plurality of registers, wherein
two or more multi-rail null convention logic (NCL) data values output from a first one or more of the plurality of registers are combined by one or more unate gates to provide at least one multi-rail NCL input to a second one of the plurality of registers, wherein the two or more multi-rail NCL data values each alternate between a valid state and a null state, and the global acknowledge signal switches to a first state when all of the two or more multi-rail NCL data values output from all of the plurality of registers are in respective valid states, and the global acknowledge signal switches to a second state when all of the two or more NCL multi-rail values data output from all of the plurality of registers are in the null state.

13. The self-timed processor of claim 12, wherein at least some of the plurality of registers comprise threshold gates.

14. The self-timed processor of claim 12, wherein the global acknowledge tree comprises gates that are only threshold gates, and which provide input completeness.

15. The self-timed processor of claim 12, wherein at least one of the plurality of registers receives data from a source external to the self-timed processor, and
the global acknowledge signal is provided to the source.

16. The self-timed processor of claim 12, wherein
the global acknowledge signal switches to a first state to signal the functional blocks to enter a null phase when all of the two or more multi-rail NCL data values output from all of the plurality of registers are in respective valid states, and
the global acknowledge signal switches to a second state to signal the functional blocks to enter a data phase when all of the one or more multi-rail NCL data values output from all of the plurality of registers are in a null state.

17. A method of processing data within a self-timed processor, comprising:
combining two or more multi-rail null convention logic (NCL) data values output from a first one or more of a plurality of registers using one or more unate gates to provide at least one multi-rail NCL input to a second one of the plurality of registers, wherein the two or more multi-rail NCL data values each alternate between a valid state and a null state, and
generating a global acknowledge signal provided to all of the plurality of registers, wherein
the global acknowledge signal switches to a first state when all of the two or more multi-rail NCL data values output from all of the plurality of registers are in respective valid states, and
the global acknowledge signal switches to a second state when all of the two or more NCL multi-rail values data output from all of the plurality of registers are in the null state.

18. The method of claim 17, wherein
generating the global acknowledge signal is performed by an acknowledge tree comprising gates that are only threshold gates, and which provide input completeness.

19. The method of claim 17, further comprising:
receiving data from a source external to the self-timed processor, and
providing the global acknowledge signal to the source.

20. The method of claim 17, further comprising:
providing data to a destination external to the self-timed processor, and
providing the global acknowledge signal to the destination,
providing the global acknowledge signal to the source.

* * * * *